(12) United States Patent
Ogasawara et al.

(10) Patent No.: US 10,707,302 B2
(45) Date of Patent: Jul. 7, 2020

(54) SEMICONDUCTOR DEVICE MANUFACTURING METHOD AND SEMICONDUCTOR DEVICE

(71) Applicant: SHINDENGEN ELECTRIC MANUFACTURING CO., LTD., Tokyo (JP)

(72) Inventors: Atsushi Ogasawara, Hanno (JP); Fumihiro Homma, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 294 days.

(21) Appl. No.: 15/745,828

(22) PCT Filed: Nov. 25, 2016

(86) PCT No.: PCT/JP2016/084913
§ 371 (c)(1),
(2) Date: Jan. 18, 2018

(87) PCT Pub. No.: WO2018/096642
PCT Pub. Date: May 31, 2018

(65) Prior Publication Data
US 2020/0083321 A1     Mar. 12, 2020

(51) Int. Cl.
*H01L 29/06*     (2006.01)
*H01L 21/268*    (2006.01)
*H01L 21/762*    (2006.01)

(52) U.S. Cl.
CPC ........ *H01L 29/0638* (2013.01); *H01L 21/268* (2013.01); *H01L 21/76237* (2013.01)

(58) Field of Classification Search
None
See application file for complete search history.

(56) References Cited

U.S. PATENT DOCUMENTS 4,298,881 A * 11/1981 Sakurada ............ H01L 23/3178
257/129
4,484,214 A * 11/1984 Misawa ................ H01L 23/291
257/147

(Continued)

FOREIGN PATENT DOCUMENTS

JP    2007-311655    11/2007
JP    2010-118585     5/2010

(Continued)

OTHER PUBLICATIONS

International Search Report and Written Opinion of the ISA for PCT/JP2016/084913, dated Jan. 31, 2017, 6 pages.

*Primary Examiner* — Calvin Y Choi
(74) *Attorney, Agent, or Firm* — Nixon & Vanderhye P.C.

(57) ABSTRACT

A semiconductor device manufacturing method includes: a pretreatment step of performing a hydrophobic treatment on a first exposed region of an exposed surface, an n-type semiconductor layer being exposed from the first exposed region, and a pn junction being exposed from the exposed surface; an impurity supplying step of supplying an n-type impurity to the first exposed region; a channel stopper forming step of irradiating the first exposed region with a laser beam to introduce the n-type impurity into the n-type semiconductor layer, thus forming a channel stopper; and a glass layer forming step of forming a glass layer using a glass composition so as to cover the exposed surface.

11 Claims, 7 Drawing Sheets

(56) References Cited

U.S. PATENT DOCUMENTS

| | | | | |
|---|---|---|---|---|
| 4,666,557 A | * | 5/1987 | Collins | H01L 21/2255 |
| | | | | 204/192.37 |
| 2008/0070377 A1 | * | 3/2008 | Morimoto | H01L 21/76254 |
| | | | | 438/459 |
| 2010/0048006 A1 | * | 2/2010 | Huang | H01L 21/2225 |
| | | | | 438/542 |

FOREIGN PATENT DOCUMENTS

| | | |
|---|---|---|
| WO | WO 2013/168314 | 11/2013 |
| WO | WO 2013/168314 | 12/2015 |

\* cited by examiner

SEMICONDUCTOR DEVICE MANUFACTURING METHOD AND SEMICONDUCTOR DEVICE

This application is the U.S. national phase of International Application No. PCT/JP2016/084913, filed Nov. 25, 2016, which designated the U.S., the entire contents of which is hereby incorporated by reference.

TECHNICAL FIELD

The present invention relates to a semiconductor device manufacturing method and a semiconductor device.

BACKGROUND ART

Regarding formation of a channel stopper for increasing a withstand voltage of a semiconductor device, there is a known manufacturing method in which a laser beam is irradiated to a bottom surface of a groove where an impurity of a first conductivity type has been supplied in advance, thus introducing the impurity of the first conductivity type into a first semiconductor layer (see Patent Document 1). In the manufacturing method of Patent Document 1, it is possible to form the channel stopper by scanning the laser beam, so that a mask forming step becomes unnecessary.

CITATION LIST

Patent Document

[Patent Document 1] Japanese Patent Application Laid-Open Publication No. 2007-311655

SUMMARY OF THE INVENTION

Problems to be Solved by the Invention

Incidentally, in recent years, there is an increasing demand to ensure normal operation of semiconductor devices even in a higher temperature environment. In other words, more reliable semiconductor devices are required.

The present invention has been made in view of such a problem, and has an object to provide a semiconductor device manufacturing method and a semiconductor device, which can provide a highly reliable semiconductor device.

A semiconductor device manufacturing method according to one aspect of the present invention includes: a semiconductor substrate preparing step of preparing a semiconductor substrate having an exposed surface where a pn junction is exposed, the pn junction being formed at a junction portion between a first semiconductor layer of a first conductivity type and a second semiconductor layer of a second conductivity type opposite to the first conductivity type; a pretreatment step of performing a hydrophobic treatment on a first exposed region of the exposed surface where the first semiconductor layer is exposed; an impurity supplying step of supplying an impurity of the first conductivity type to the first exposed region; a channel stopper forming step of irradiating the first exposed region with a laser beam to introduce the impurity of the first conductivity type into the first semiconductor layer, thus forming a channel stopper; and a glass layer forming step of forming a glass layer using a glass composition so as to cover the exposed surface.

Additionally, a semiconductor device according to one aspect of the present invention is manufactured by the semiconductor device manufacturing method and includes: a semiconductor element having the exposed surface; the channel stopper formed in the first exposed region of the semiconductor element; and the glass layer formed so as to cover the exposed surface of the semiconductor element.

Effects of the Invention

According to the present invention, by the hydrophobic treatment, in the step of forming the channel stopper, it is possible to increase the concentration of the impurity of the first conductivity type introduced into the first semiconductor layer by irradiating the laser light. As a result, even in a higher temperature environment, spreading of the depletion layer can be suppressed at the time of application of the reverse bias voltage, so that occurrence of leakage current can be suppressed. Therefore, it is possible to operate the semiconductor device normally. In other words, a highly reliable semiconductor device can be provided.

MODE FOR CARRYING OUT THE INVENTION

First Embodiment

Hereinafter, a first embodiment of the present invention will be described with reference to FIGS. 1 to 4.
(Configuration of Semiconductor Device)

A semiconductor device according to the present embodiment is a mesa semiconductor device provided with a channel stopper. Hereinafter, a configuration of the semiconductor device according to the present embodiment will be described with reference to FIG. 1.

Figure 1:
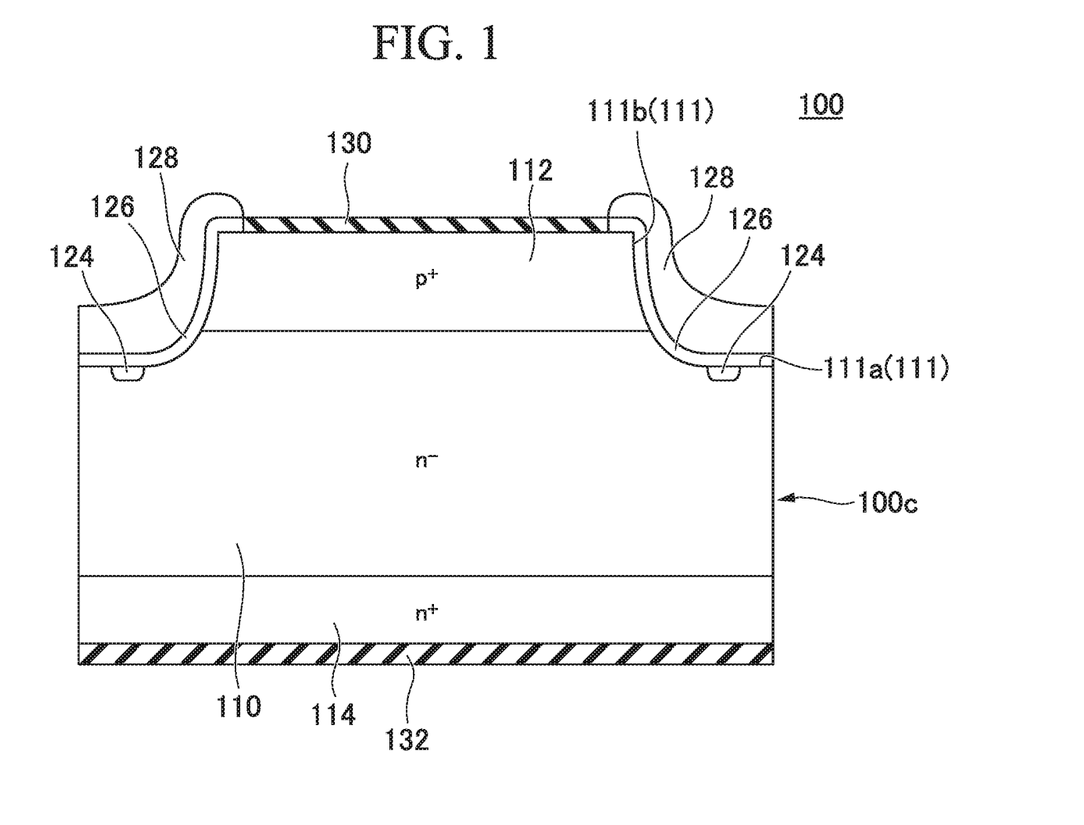
FIG. 1 is a cross-sectional view showing a configuration of a semiconductor device according to a first embodiment.

As shown in FIG. 1, a semiconductor device 100 according to the present embodiment includes: a semiconductor element 100c having first semiconductor layer 110 of $n^-$-type (first conductivity type) and a second semiconductor layer 112 of $p^+$-type (second conductivity type) disposed on one main surface side of the first semiconductor layer 110; a channel stopper 124; and a glass layer 128.

The semiconductor element 100c further includes a third semiconductor layer 114 of $n^+$-type (first conductivity type) disposed on the other main surface side of the first semiconductor layer 110. The semiconductor device 100 further includes: an oxide film 126; an anode electrode 130 formed on a surface of the second semiconductor layer 112; and a cathode electrode 132 formed on a surface of the third semiconductor layer 114.

The semiconductor element 100c has an exposed surface 111 where a pn junction formed at a junction portion between the first semiconductor layer 110 and the second semiconductor layer 112 is exposed. The channel stopper 124 is formed in a first exposed region 111a of the exposed surface 111 where the first semiconductor layer 110 is exposed. The oxide film 126 is formed so as to cover the exposed surface 111. The glass layer 128 is formed so as to cover the oxide film 126.

As shown in FIGS. 2 and 3, a semiconductor device manufacturing method according to the present embodiment includes the following steps in sequence. Each step will be described in sequence below.

(Semiconductor Layered Structure Forming Process)

Figure 2A:
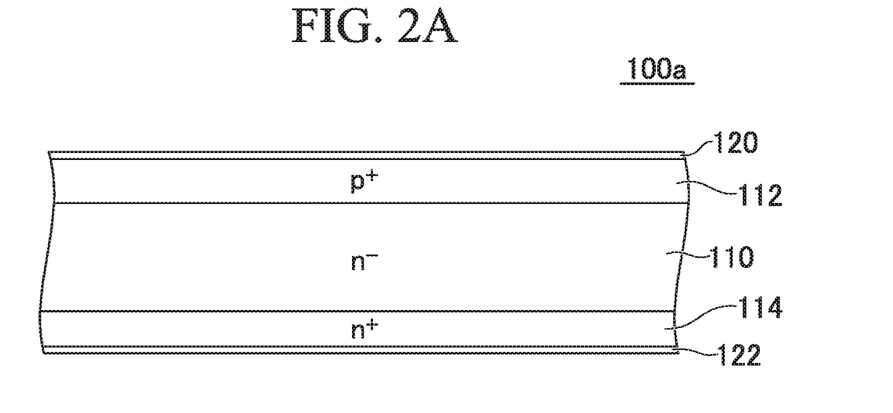
FIG. 2 is a view illustrating a semiconductor device manufacturing method according to the first embodiment.

As shown in FIG. 2A, a semiconductor layered structure forming process is a process of forming a semiconductor layered structure 100a that includes: a first semiconductor layer 110 of n$^-$-type (first conductivity type); a second semiconductor layer 112 of p$^+$-type (second conductivity type) disposed on one main surface side of the first semiconductor layer 110; and a third semiconductor layer 114 of n$^+$-type (first conductivity type) disposed on the other main surface side of the first semiconductor layer 110.

In the semiconductor layered structure forming process, first, the second semiconductor layer 112 of p$^+$-type is formed by diffusing a p-type impurity from one main surface of the silicon substrate of n$^-$-type (first semiconductor layer of n$^-$-type) 110. Additionally, the third semiconductor layer 114 of n+-type is formed by diffusing an n-type impurity from the other main surface of the silicon substrate 110 of n$^-$-type. Thus, the semiconductor layered structure 100a in which the pn junction parallel to the main surface is formed at the junction portion between the first semiconductor layer 110 of n$^-$-type and the second semiconductor layer 112 of p$^+$-type. Thereafter, a surface oxide film 120 is formed by thermal oxidation on the surface of the second semiconductor layer 112 of p$^+$-type. Additionally, a surface oxide film 122 is formed by thermal oxidation on the surface of the third semiconductor layer 114 of n+-type.

An impurity concentration of the first semiconductor layer 110 is, for example, $2\times10^{14}$ cm$^{-3}$. An impurity concentration of the second semiconductor layer 112 is, for example, $2\times10^{19}$ cm$^{-3}$. An impurity concentration of the third semiconductor layer 114 is, for example, $2\times10^{19}$ cm$^{-3}$. A thickness of the first semiconductor layer 110 is, for example, 150 μm. A thickness of the second semiconductor layer 112 is, for example, 60 μm. A thickness of the third semiconductor layer 114 is, for example, 40 μm.

(Semiconductor Substrate Preparing Step)

Figure 2B:
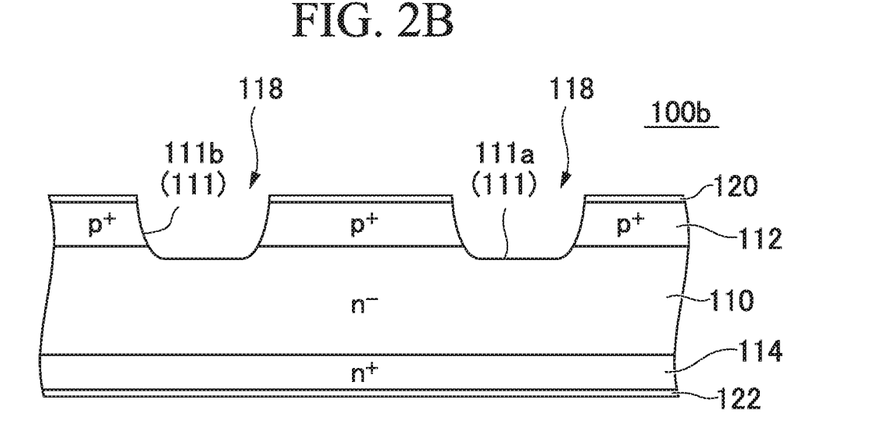

As shown in FIGS. 2A and 2B, a semiconductor substrate preparing step is a step of forming a groove 118 from the one main surface side of the semiconductor layered structure 100a and preparing a semiconductor substrate 100b having, on an inner surface of the groove 118, the exposed surface 111 where the pn junction formed at the junction portion between the first semiconductor layer 110 and the second semiconductor layer 112 is exposed.

The formation of the groove 118 is performed by, for example, etching. First, the surface oxide film 120 on the second semiconductor layer 112 is etched. Further, the semiconductor layered structure 100a is etched from the second semiconductor layer 112 side. As a result, the groove 118 having a depth exceeding the pn junction is formed from the one main surface of the semiconductor layered structure 100a. At this time, the exposed surface 111 is formed on the inner surface of the groove 118. The exposed surface 111 is composed of a first exposed region 111a where the first semiconductor layer 110 is exposed and a second exposed region 111b where the second semiconductor layer 112 is exposed. As an etching solution, for example, a mixed solution of hydrofluoric acid (HF), nitric acid (HNO$_3$) and acetic acid (CH$_3$COOH) e.g., HF:HNO$_3$:CH$_3$COOH=1:4:1) is used.

A width of the groove 118 is, for example, 300 μm, while a depth of the groove 118 is, for example, 90 μm.

(Pretreatment Step)

A pretreatment step is a step of performing a hydrophobic treatment on the first exposed region 111a of the exposed surface 111 where the first semiconductor layer 110 is exposed.

The hydrophobic treatment is performed by, for example, immersing the first exposed region 111a into a hydrophobic treatment solution. As the hydrophobic treatment solution, for example, a mixed solution of hydrofluoric acid (HF) and nitric acid (HNO$_3$) can be preferably used. More preferably, HF:HNO$_3$=1:25. A time for immersing the first exposed region 111a is preferably 1 to 3 minutes. A temperature at which the first exposed region 111a is immersed is preferably 20 to 30° C. After the immersion, the first exposed region 111a is cleaned with, for example, water.

(Impurity Supplying Step)

Figure 2C:
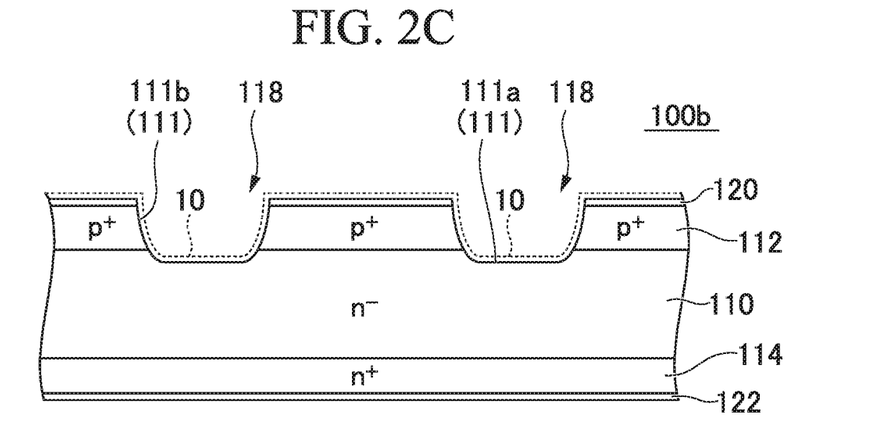

As shown in FIG. 2C, an impurity supplying step is a step of supplying an impurity 10 of n-type to the first exposed region 111a.

The impurity supplying step is performed by, for example, applying a liquid containing the impurity 10 of n-type (first conductivity type) onto the first exposed region 111a. As the liquid containing the impurity 10 of n-type, for example, a liquid obtained by dissolving a phosphorus compound (e.g., pyrophosphoric acid) in an organic solvent (e.g., ethanol), or the like, can be preferably used. As a coating method, a known method such as a dipping method, a spinner method, a spray method, or the like, can be used.

An amount of the impurity 10 of n-type supplied to the first exposed region 111a is adjusted so that the impurity concentration of the channel stopper 124 (see FIG. 3A) formed in the first exposed region 111a in a channel stopper forming step described later becomes an optimum concentration (e.g., $1\times10^{19}$ cm$^{-3}$).

(Channel Stopper Forming Step)

Figure 3A:
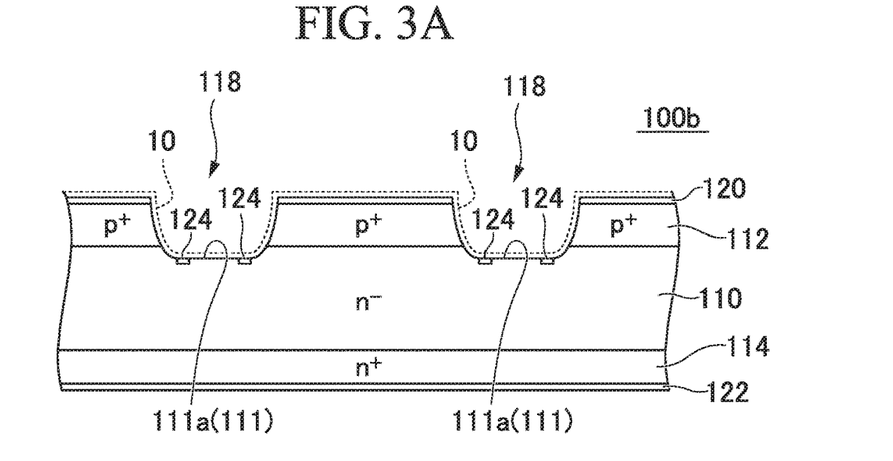
FIG. 3 is a view illustrating the semiconductor device manufacturing method according to the first embodiment.

As shown in FIG. 3A, the channel stopper forming step is a step of introducing the impurity 10 of n-type (first conductivity type) into the first semiconductor layer 110 to form the channel stopper 124.

The introduction of the impurity 10 of n-type is performed by, for example, irradiating the first exposure region 111a with a laser light. As the laser light, for example, a green laser having a wavelength of 532 nm can be used. For example, the laser light is pulse-oscillated with a pulse of 30 kHz and is scanned along the groove 118 at a speed of 300 mm/sec. In this step, the channel stopper 124 is formed to a predetermined depth (first depth).

In this step, the channel stopper 124 extending along the groove 118 is formed. The number of channel stoppers 124 may be only one. In the present embodiment, the two channel stoppers 124, 124 are formed so as to be isolated from each other by 60 μm in the width direction of the groove 118.

After the irradiation with the laser light, the remaining impurity 10 of n-type is removed. The removal of the impurity is performed by, for example, etching. As an etching liquid, for example, the same as that used in the semiconductor substrate preparing step can be used.

(Oxide Film Forming Step)

Figure 3B:
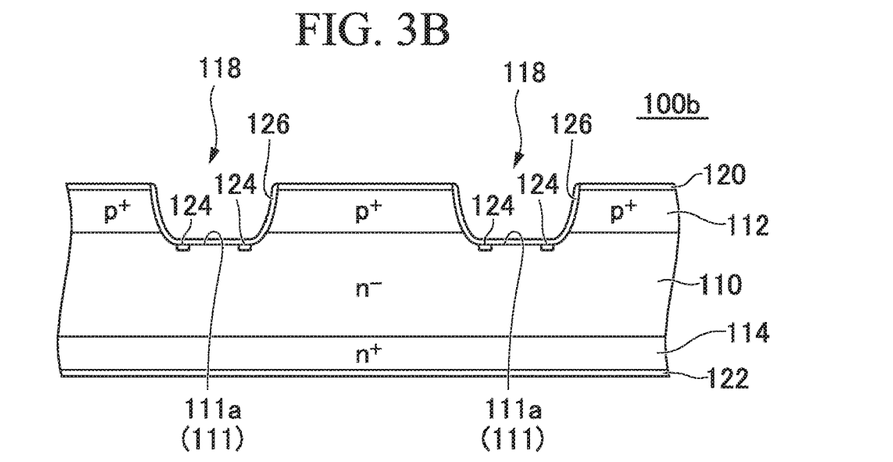

As shown in FIG. 3B, an oxide film forming step is a step of, after the channel stopper forming step and before a glass layer forming step described later, forming the oxide film 126 so as to cover the exposed surface 111.

The formation of the oxide film 126 is performed by, for example, a thermal oxidation method using dry oxygen. As a result, a silicon oxide film is formed on the inner surface of the groove 118.

The formation of the oxide film 126 is performed by, for example, placing the semiconductor substrate 100b in a diffusion furnace and then treating it while flowing oxygen gas. A treatment temperature is preferably 900° C. or higher. A treatment time is preferably 90 minutes at the treatment temperature 900° C.

A thickness of the oxide film 126 is 5 nm to 60 nm, preferably 50 nm. If the thickness of the oxide film 126 is less than 5 nm, the reverse current reduction effect might not be obtained, which is not preferable. On the other hand, if the thickness of the oxide film 126 exceeds 60 nm, it might not be able to form the glass layer 128 by electrophoresis in a glass layer forming step described later, which is not preferable.

(Glass Layer Forming Step)

Figure 3C:
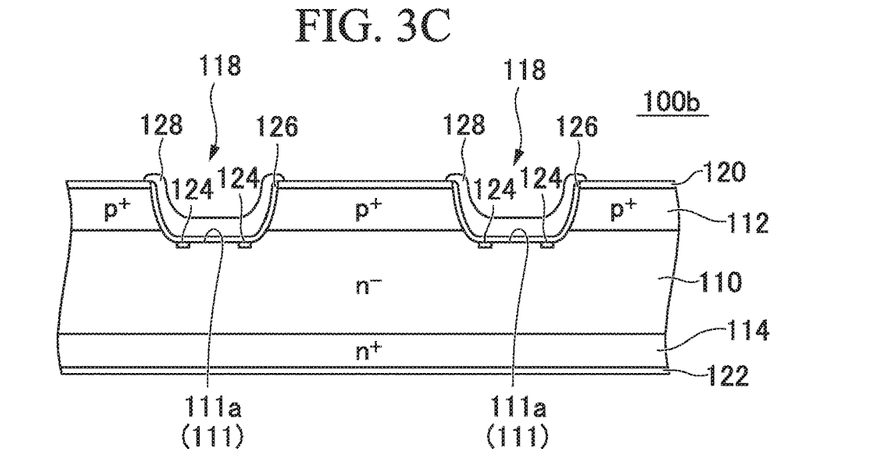

As shown in FIG. 3C, the glass layer forming step is a step of forming the glass layer 128 for passivation so as to cover the exposed surface 111 using a glass composition.

In the glass layer forming step, first, a glass composition is deposited by electrophoresis on the inner surface of the groove 118 and the surface of the se conductor substrate 100b in the vicinity thereof. Then the deposited glass composition is baked. Thereby, the glass layer 128 is formed. As a result, the exposed surface 111 on the inner surface of the groove 118 is covered with the glass layer 128 via the oxide film 126.

A baking temperature of the glass composition is, for example, 900° C. Additionally, a baking time of the glass composition is, for example, 15 to 30 minutes at the baking temperature 900° C.

As the glass composition, it is possible to use, for example, a glass composition containing at least two alkaline earth metal oxides of $SiO_2$, $Al_2O_3$, $B_2O_3$, ZnO, CaO, BaO and MgO, and substantially not containing Pb, As, Sb, Li, Na, and K.

As the glass composition, it is preferable to use a glass composition satisfying that the amount of $SiO_2$ is within the range of 49.5 mol % to 64.3 mol %, the amount of $Al_2O_3$ is within the range of 3.7 mol % to 14.8 mol %, the amount of $B_2O_3$ is within the range of 8.4 mol % to 17.9 mol %, the amount of ZnO is within the range of 3.9 mol % to 14.2 mol %, the amount of the alkaline earth metal oxide is within the range of 7.4 mol % to 12.9 mol %.

Here, in this case, "to contain a specific component" s not only a case where it contains only the specific component, but also a case where it further contains, in addition to the certain component, a component normally containable in the glass composition. Additionally, "substantially does not contain a specific element" means that the specific element is not contained as a component, and it does not exclude a glass composition in which the above specific element is mixed as an impurity in the raw material of each component constituting the glass. Further, "not containing a specific element" means that it does not contain an oxide of the specific element, a nitride of the specific element, or the like.

The reason that the amount of $SiO_2$ is set within the range of 49.5 mol % to 64.3 mol % is as follows. When the amount of $SiO_2$ is less than 49.5 mol %, the chemical resistance of the glass layer 128 might be lowered, or the insulating property of the glass layer 128 might be deteriorated. When the amount of $SiO_2$ exceeds 64.3 mol %, the baking temperature of the glass composition might increase.

The reason that the amount of $Al_2O_3$ is set within the range of 3.7 mol % to 14.8 mol % is as follows. When the amount of $Al_2O_3$ is less than 3.7 mol %, the chemical resistance of the glass layer 128 might be lowered, or the insulating property of the glass layer 128 might be deteriorated. When the amount of $Al_2O_3$ exceeds 14.8 mol %, the baking temperature of the glass composition might increase.

The reason that the amount of $B_2O_3$ is set within the range of 8.4 mol % to 17.9 mol % is as follows. When the amount of $B_2O_3$ is less than 8.4 mol %, the baking temperature of the glass composition might increase. When the amount of $B_2O_3$ exceeds 17.9 mol %, B (boron) diffuses into the semiconductor substrate 100b during the baking of the glass composition, and the insulating property might be deteriorated.

The reason that the amount of ZnO is set within the range of 3.9 mol % to 14.2 mol % is as follows. When the amount of ZnO is less than 3.9 mol %, the baking temperature of the glass composition might increase. When the amount of ZnO exceeds 14.2 mol %, the chemical resistance of the glass layer 128 might be lowered, or the insulating property of the glass layer 128 might be deteriorated.

Additionally, the reason that the amount of the alkaline earth metal oxide is set within the range of 7.4 mol % to 12.9 mol % is as follows. When the amount of the alkaline earth metal oxide is less than 7.4 mol %, the baking temperature of the glass composition might increase. When the amount of the alkaline earth metal oxide exceeds 12.9 mol %, the chemical resistance of the glass layer 128 might be lowered, or the insulating property of the glass layer 128 might be deteriorated.

As the glass composition, it is preferable to use one having an average coefficient of linear expansion that is within the range of $3.33 \times 10^{-6}$ to $4.13 \times 10^{-6}$ at the temperature range of 50° C. to 550° C.

The glass composition according to the present embodiment can be formed, for example, as follows. First, raw materials ($SiO_2$, $Al(OH)_3$, $H_3BO_3$, ZnO, $CaCO_3$, $Mg(OH)_2$, BaO) are compounded so as to have the above composition ratio (molar ratio). Next, the raw materials are thoroughly stirred with a mixer. Next, the stirred raw materials are placed in a platinum crucible which has been raised to a predetermined temperature (e.g., 1550° C.) in an electric furnace, and are melted for a predetermined time (e.g., 30 to 120 minutes). Next, the melt of the raw materials is poured into a water cooling roll. Thus, flaky glass flakes are obtained. Finally, the glass flakes are pulverized to a predetermined average particle size with a ball mill or the like. Thereby, a powdery glass composition is obtained.

(Electrode Forming Step)

The electrode forming step is a step of forming an anode electrode 130 and a cathode electrode 132 (see FIG. 4B) on the semiconductor substrate 100b.

In the electrode forming step, first, a photoresist is formed so as to cover the surface of the glass layer 128. Next, a portion of the one main surface of the semiconductor substrate 100b where the anode electrode 130 is not to be formed is masked with the photoresist. Next, the surface oxide film 120 is etched. As a result, the surface oxide film 120 is removed from the portion of the one main surface of the semiconductor substrate 100b where the anode electrode 130 is to be formed. Additionally, the surface oxide film 122 is removed from on the other main surface of the semiconductor substrate 100b. Next, a plating process is performed on the semiconductor substrate 100b. As a result, the anode electrode 130 is formed on the portion of the one main surface of the semiconductor substrate 100b from which the surface oxide film 120 has been removed. Additionally, the cathode electrode 132 is formed on the other main surface of the semiconductor substrate 100b.

(Semiconductor Substrate Cutting Step)

Figure 4A:
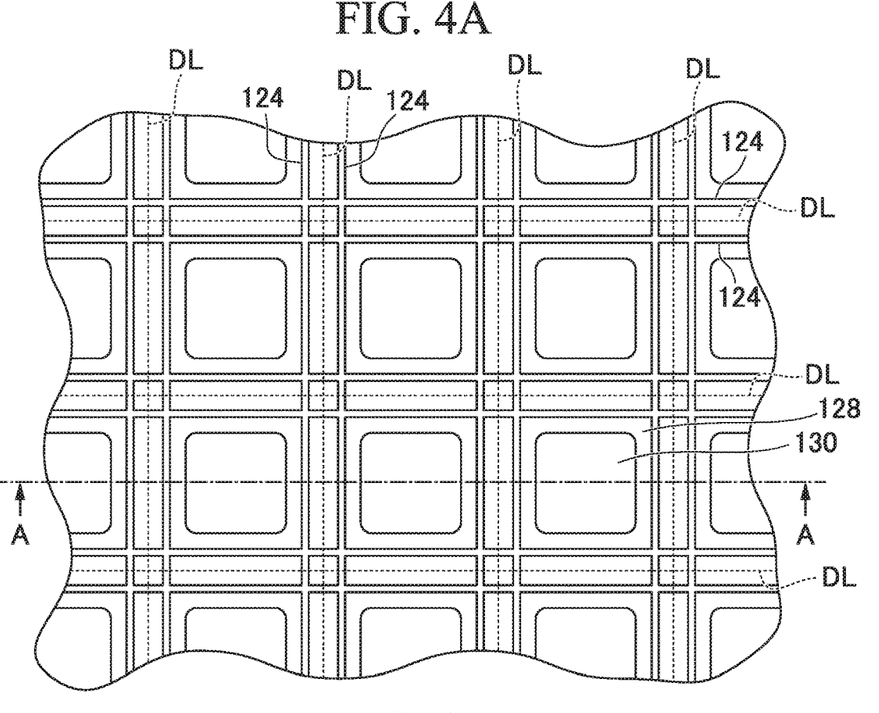
FIG. 4 is a view illustrating a semiconductor substrate cutting step according to the first embodiment.
Figure 4B:
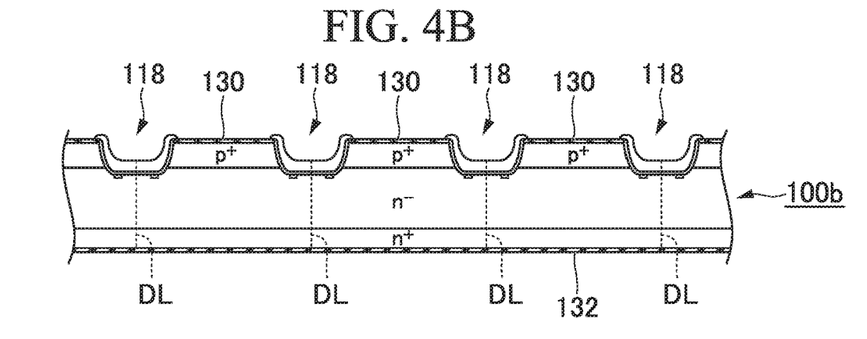

As shown in FIG. 4, a semiconductor substrate cutting step is a step of cutting the semiconductor substrate 100b into chips to manufacture the semiconductor device 100. FIG. 4B is a cross section taken along a line A-A in FIG. 4A.

Figure 4C:
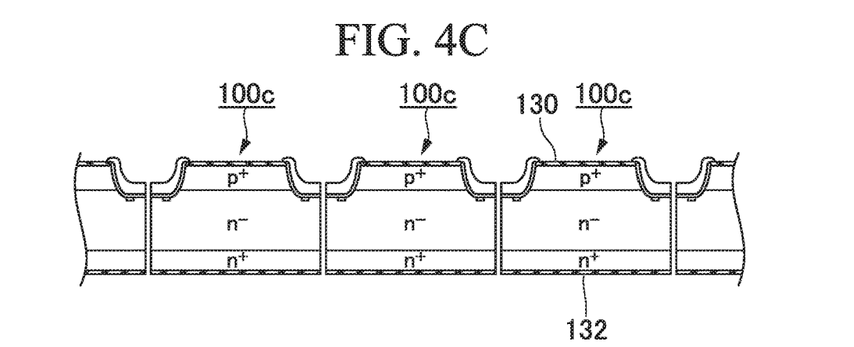

In the semiconductor substrate cutting step, as shown in FIGS. 4A and 4B, the semiconductor substrate 100b is cut using, for example, a dicing saw, along dicing lines DL each passing through the center, in the width direction, of the groove 118. As a result, as shown in FIG. 4C, the semiconductor substrate 100b is formed into chips, so that the semiconductor device 100 which is a mesa-type pn diode is manufactured.

As described above, according to the semiconductor device manufacturing method of the present embodiment, the hydrophobic treatment is performed in the pretreatment step, thereby making it possible to increase the concentration of the impurity 10 of the first conductivity type introduced into the first semiconductor layer 110 by the irradiation of the laser light in the channel stopper forming step. This point will be described with reference to FIG. 7.

Figure 7:
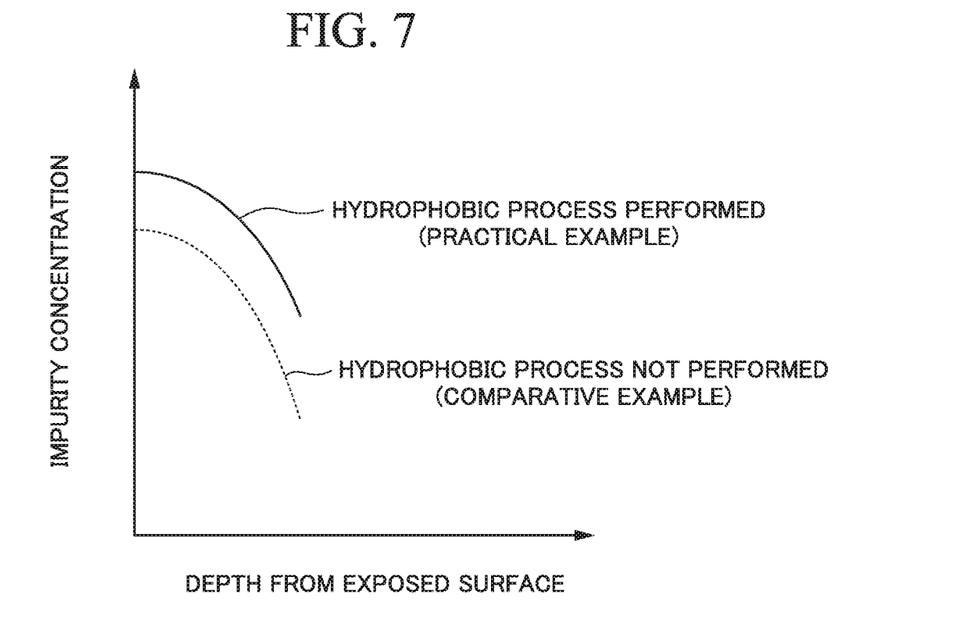
FIG. 7 is a graph showing a relationship between a depth direction from an exposed surface and an impurity concentration after a channel stopper forming step.

A practical example shown in FIG. 7 is a result when the following processing was performed. First, in the pretreatment step of the present embodiment, a hydrophobic treatment was performed using a mixed solution of hydrofluoric acid and nitric acid ($HF:HNO_3=1:25$). Next, in the impurity supplying step, a liquid in which pyrophosphoric acid was dissolved in ethanol was applied by a dipping method. Next, in the channel stopper forming step, a green laser with a wavelength of 532 nm was irradiated while pulsing with a pulse of 30 kHz.

A comparative example is a result of having performed, in the pretreatment step of the present embodiment, the impurity supplying step and the channel stopper forming step without performing the hydrophobic treatment, under the same conditions as in the practical example.

In the practical example, the concentration of the impurity 10 becomes higher than that in the comparative example, regardless of the depth (position) from the exposed surface 111. For example, the peak of the concentration of the impurity 10 in the vicinity of the exposed surface 111 is about $10^{19}/cm^3$ in the comparative example, while it is about $10^{20}/cm^3$ in the practical example. Therefore, in order to raise the concentration of the channel stopper, it is effective to perform the hydrophobic treatment in the pretreatment step.

Since the concentration of the impurity 10 can be increased as described above, spreading of the depletion layer can be suppressed at the time of application of the reverse bias voltage even in a higher temperature environment, so that generation of leakage current can be suppressed. Therefore, the semiconductor device 100 can be normally operated. In other words, a highly reliable semiconductor device 100 can be provided.

Additionally, according to the semiconductor device manufacturing method of the present embodiment, in the glass layer forming step, the glass layer 128 is formed by baking the layer made of the glass composition formed so as to cover the exposed surface 111. Thereby, the impurity 10 of the first conductivity type introduced into the first exposed region 111a of the exposed surface 111 can be diffused in the first semiconductor layer 110 by the heat applied in the baking. This makes it possible to further suppress the spreading of the depletion layer at the time of application of the reverse bias voltage. As a result, the generation of leakage current can be further suppressed. Therefore, a semiconductor device 100 with higher reliability can be provided.

Further, according to the semiconductor device manufacturing method of the present embodiment, after the channel stopper forming step and before the glass layer forming step, in the oxide film forming step, the oxide film 126 is formed so as to cover the exposed surface 111. As a result, the impurity 10 of the first conductivity type introduced into the first exposed region 111a of the exposed surface 111 can be diffused in the first semiconductor layer 110 by the heat applied in the formation of the oxide film 126. This point will be described with reference to FIG. 8.

Figure 8:
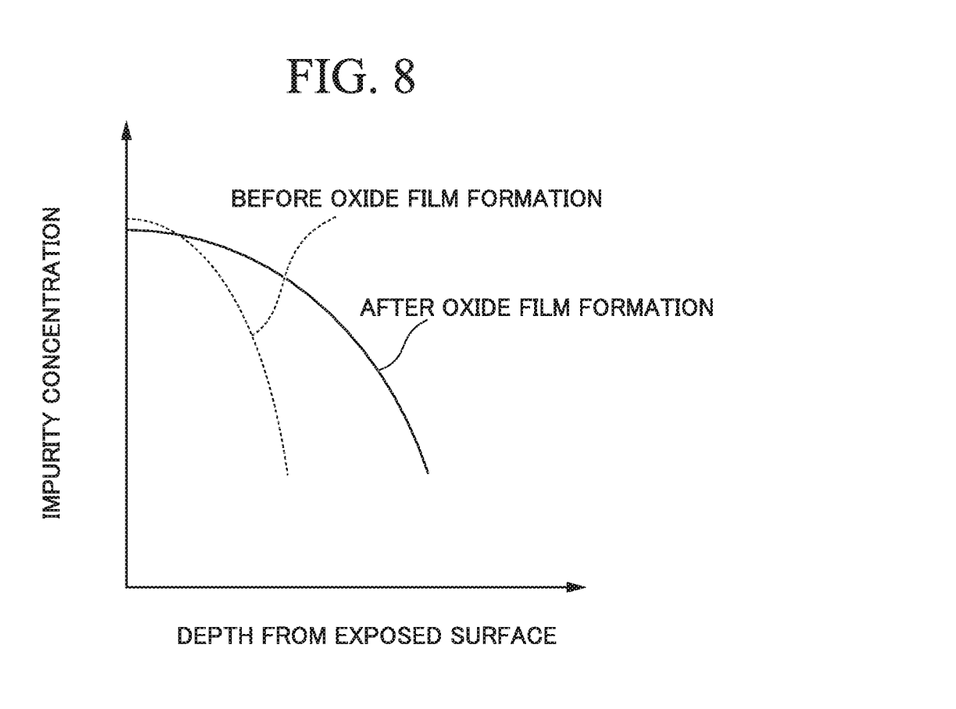
FIG. 8 is a graph showing a relationship between the depth direction from the exposed surface and the impurity concentration before and after an oxide film forming step.

As shown in FIG. 8, after the oxide film forming step, the impurity 10 thermally diffuse from the exposed surface 111 to a deeper position than before the oxide film forming step. As a result, the height of the peak of the concentration of the impurity 10 in the vicinity of the exposed surface 111 decreases through the oxide film forming step, whereas the width of the peak spreads from the exposed surface 111 to a deeper position. In other words, in the oxide film forming step, the region of the channel stopper 124 is enlarged to a second depth deeper than the first depth that is after the channel stopper forming step.

This makes it possible to suppress the spreading of the depletion layer at the time of application of the reverse bias voltage. As a result, the generation of leakage current can be suppressed. Therefore, a semiconductor device 100 with higher reliability can be provided.

Additionally, according to the semiconductor device manufacturing method of the present embodiment, it is possible to introduce the impurity deeper without increasing the power of the laser. This makes it possible to suppress generation of surface defects based on the laser irradiation. Therefore, in the manufactured semiconductor device 100, occurrence of leakage current can be suppressed.

Further, according to the semiconductor device manufacturing method of the present embodiment, the glass composition as the raw material of the glass layer 128 does not substantially contain Pb, As, and Sb, which are environmentally harmful substances. Thereby, the environmental burden can be reduced. Moreover, the glass layer 128 is made of lead-free glass having a dielectric constant lower than that of the lead-containing glass. Thereby, even when a reverse bias voltage is applied in a high-temperature environment to a resin-molded semiconductor device in which the semiconductor device 100 is molded with resin, high density ions are suppressed from being induced into an interface between the mold resin and the glass layer 128 and an interface between the glass layer 128 and the first semiconductor layer 110. As a result, the high-temperature reverse bias withstand capability can be made higher than that of a resin-sealed semiconductor device obtained by molding with a resin a semiconductor device obtained using a conventional lead-containing glass.

Moreover, according to the semiconductor device manufacturing method of the present embodiment, the glass composition as the raw material of the glass layer 128 does not substantially contain Li, Na, and K. Thereby, even if B (boron) is contained in the glass composition, B (boron) does not diffuse into silicon from the glass layer 128 during the baking of the glass composition. Thereby, a highly reliable semiconductor device 100 can be provided.

Additionally, according to the semiconductor device manufacturing method of the present embodiment, since the glass layer 128 is formed by baking the layer made of the glass composition for protecting the semiconductor junction including glass fine particles prepared from the melt obtained by melting raze materials containing at least two alkaline earth metal oxides of $SiO_2$, $Al_2O_3$, $B_2O_3$, ZnO, CaO, MgO, and BaO, but substantially not containing Pb, As, Sb, Li, Na and K, it is possible to bake the glass composition at a relatively low temperature. This makes it difficult for the glass composition to crystallize during the baking process of the glass composition. As a result, it is possible to stably manufacture a semiconductor device 100 having a low reverse leakage current.

Further, according to the semiconductor device manufacturing method of the present embodiment, the glass composition satisfies that the amount of $SiO_2$ is within the range of 49.5 mol % to 64.3 mol %, the amount of $Al_2O_3$ is 3.7 mol % to 14.8 mol %, the amount of $B_2O_3$ is within the range of 8.4 mol % to 1.7.9 mol %, the amount of ZnO is within the range of 3.9 mol % to 14.2 mol %, and the amount of the alkaline earth metal oxide is within the range of 7.4 mol % to 12.9 mol %. Thereby, it is possible to suppress the increase in baking temperature of the glass composition, the deterioration of the chemical resistance of the glass layer 128, and the deterioration of the insulation property of the glass layer 128.

Moreover, according to the semiconductor device manufacturing method of the present embodiment, the average coefficient of linear expansion of the glass composition within the temperature range of 50° C. to 550° C. is within the range of $3.33 \times 10^{-6}$ to $4.08 \times 10^{-6}$. As a result, since the glass composition has a coefficient of linear expansion close to that of silicon, it is possible to prevent the semiconductor substrate 100b from warping during the manufacturing process.

Additionally, according to the semiconductor device manufacturing method of the present embodiment, the exposed surface 111 is the inner surface of the groove 118 formed so as to separate the second semiconductor layer 112 into a mesa shape and to reach the first semiconductor layer 110. This makes it possible to provide the channel stopper 124 on the bottom surface of the groove 118 in the mesa semiconductor device 100. As a result, even when the depletion layer of the pn junction spreads at a high voltage, the depletion layer is terminated by the channel stopper 124 and will not be exposed to the chip-section cross section. Therefore, it is possible to increase the withstand voltage of the mesa semiconductor device 100.

Further, according to the semiconductor device manufacturing method of the present embodiment, the mixed solution of hydrofluoric acid (HF) and nitric acid ($HNO_3$) is used in the hydrophobic treatment in the pretreatment step. This makes it possible to perform the hydrophobic treatment using chemicals commonly used in ordinary semiconductor processes.

Second Embodiment

Hereinafter, a second embodiment of the present invention will be described. A semiconductor device according to the present embodiment is a planar semiconductor device provided with a channel stopper. Hereinafter, a configuration of the semiconductor device according to the present embodiment will be described with reference to FIG. 6D.

Figure 6A:
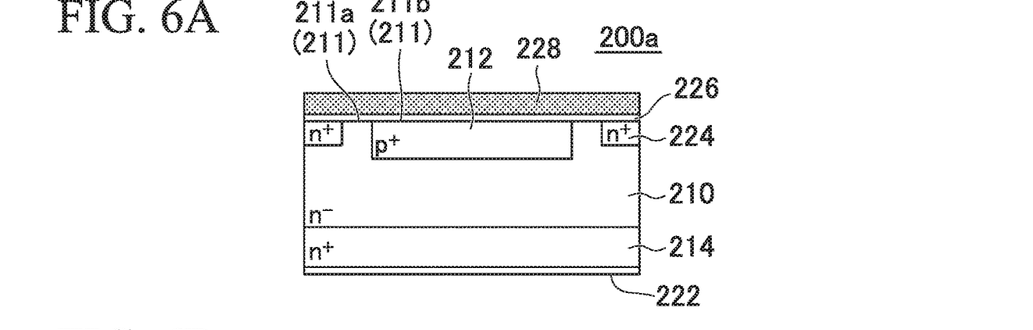
FIG. 6 is a view illustrating the semiconductor device manufacturing method according to the second embodiment.
Figure 6B:
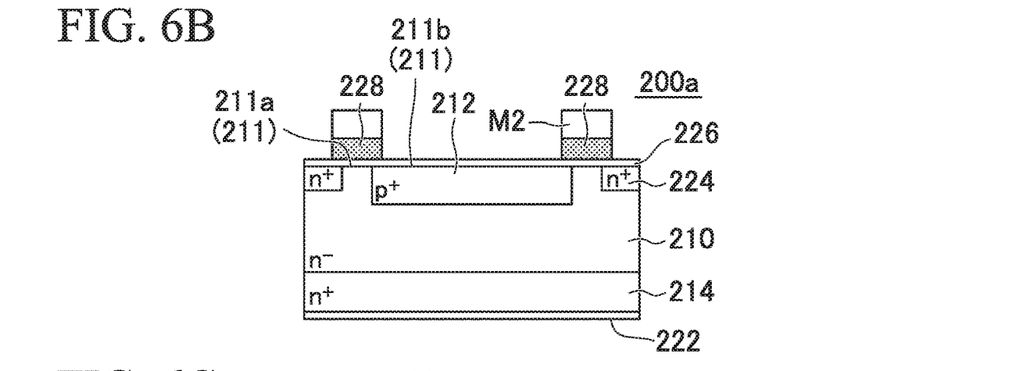
Figure 6C:
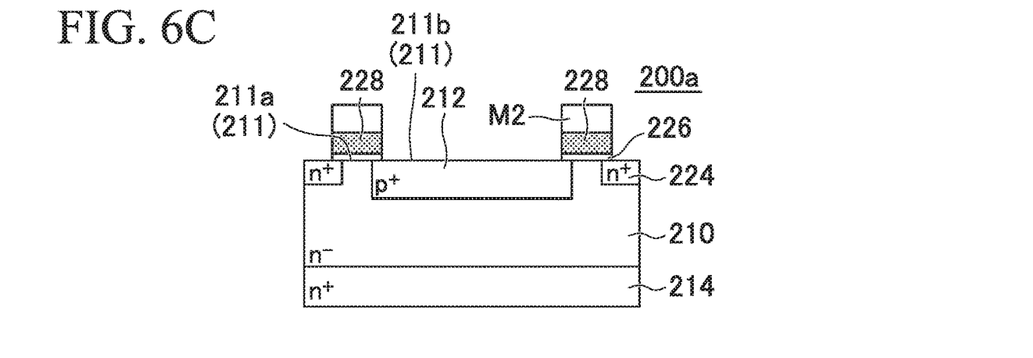
Figure 6D:
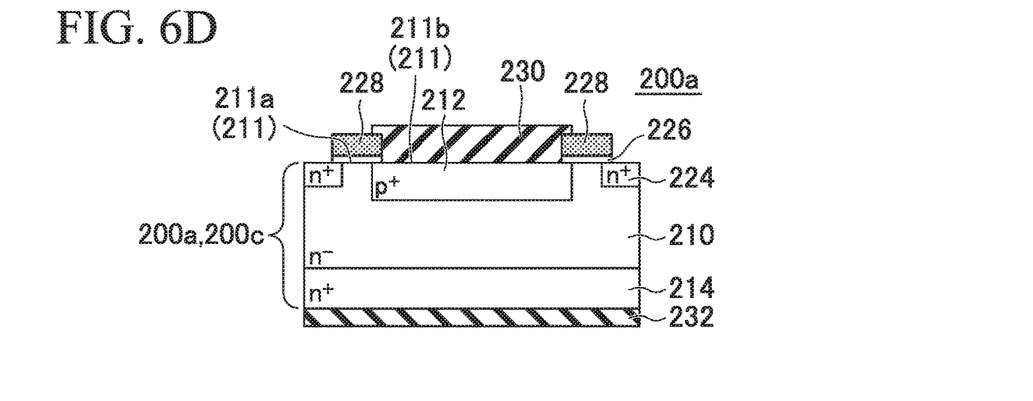

As shown in FIG. 6D, a semiconductor device 200 according to the present embodiment includes: a semiconductor element 200c having a first semiconductor layer 210 of $n^-$-type (first conductivity type) and a second semiconductor layer 212 of $p^+$-type (second conductivity type) disposed on one main surface side of the first semiconductor layer 210; a channel stopper 224; and a glass layer 228.

The semiconductor element 200c further includes a third semiconductor layer 214 of $n^+$-type (first conductivity type) disposed on the other main surface side of the first semiconductor layer 210. The semiconductor device 200 further includes: an oxide film 226; an anode electrode 230 formed on a surface of the second semiconductor layer 212; and a cathode electrode 232 formed on a surface of the third semiconductor layer 214.

The semiconductor element 200c has an exposed surface 211 where a pn junction formed at a junction portion between the first semiconductor layer 210 and the second semiconductor layer 112 is exposed. The channel stopper 224 is formed in the first exposed region 211a of the exposed surface 211 where the first semiconductor layer 210 is exposed. The oxide film 226 is formed so as to cover the exposed surface 211. The glass layer 228 is formed so as to cover the oxide film 226.

As shown in FIGS. 5 and 6, the semiconductor device manufacturing method of the present embodiment includes the following steps in sequence. Each step will be described in sequence below (Semiconductor Substrate Preparing Step)

Figure 5A:
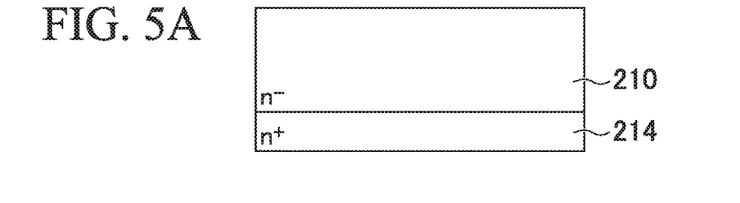
FIG. 5 is a view illustrating a semiconductor device manufacturing method according to a second embodiment.
Figure 5B:
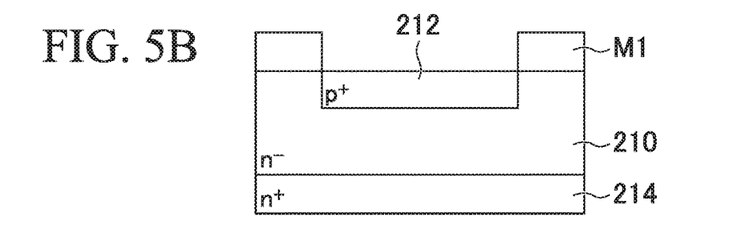
Figure 5C:
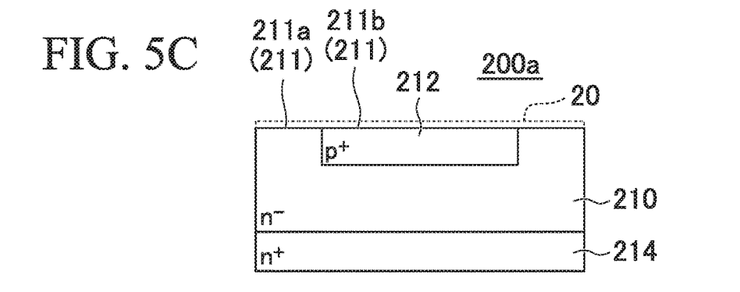

As shown in FIGS. 5A to 5C, a semiconductor layered structure forming process is a process of forming a semiconductor layered structure 200a that includes: a first semiconductor layer 210 of $n^-$-type (first conductivity type); a second semiconductor layer 212 of $p^+$-type (second conductivity type) disposed on one main surface side of the first semiconductor layer 210; and a third semiconductor layer 214 of n+-type (first conductivity type) disposed on the other main surface side of the first semiconductor layer 110.

In the semiconductor substrate preparing step, for example, first, as shown in FIG. 5A, an epitaxial layer 210 of $n^-$-type is layered on the semiconductor substrate 214 of n+-type. Next, as shown in FIG. 5B, after a mask M1 is formed, an impurity of p-type (e.g., B (Boron ion s introduced by ion implantation into a predetermined region of a surface of the epitaxial layer 210 of $n^-$-type through the mask M1. The mask M1 is provided so that a part of the one main surface of the semiconductor substrate 200a is opened. Next, a diffusion layer 212 of p+-type is formed by thermal diffusion. Next, the mask M1 is removed. Thereby, the semiconductor base 200a is prepared. At this time, the exposed surface 211 is formed on the one main surface of the semiconductor substrate 200a. The exposed surface 211 is composed of a first exposed region 211a where the first semiconductor layer 210 is exposed and a second exposed region 211b where the second semiconductor layer 212 is exposed.

(Pretreatment Step)

A pretreatment step is a step of performing hydrophobic treatment on the first exposed region 211a of the exposed surface 211 where the first semiconductor layer 210 is exposed.

The hydrophobic treatment is performed by, for example, immersing the first exposed region 211a into a hydrophobic treatment solution. As the hydrophobic treatment solution, as in the first embodiment, a mixed solution of hydrofluoric acid (HF) and nitric acid ($HNO_3$) can be preferably used.

(Impurity Supplying Step)

As shown in FIG. 5C, an impurity supplying step is a step of supplying an impurity 20 of n-type to the first exposed region 211a.

For example, the impurity supplying step is performed by, for example, applying a liquid containing an impurity 20 of n-type (first conductivity type) to the first exposure region 211a. As the liquid containing the n-type impurity 20, a liquid obtained by dissolving a phosphorus compound in an organic solvent or the like can be preferably used as in the first embodiment. As a coating method, as in the first embodiment, a known method such as a dipping method, a spinner method, a spray method, or the like can be used.

(Channel Stopper Forming Step)

Figure 5D:
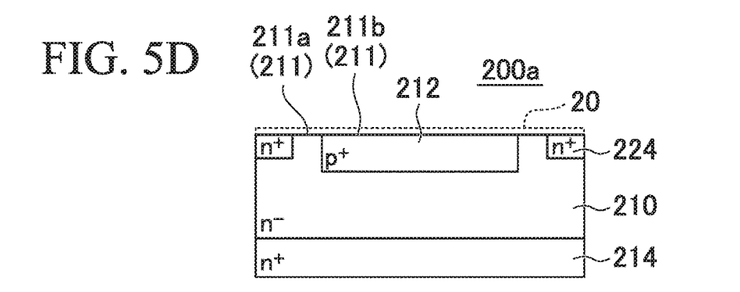

As shown in FIG. 5D, a channel stopper forming step is a step of introducing an impurity 20 of n-type (first conductivity type) into the first semiconductor layer 210 to form a channel stopper 224.

As in the first embodiment, the introduction of the impurity 10 of n-type is performed by irradiating a predetermined region of the first exposure region 211a with laser light.

(Oxide Film Forming Step)

Figure 5E:
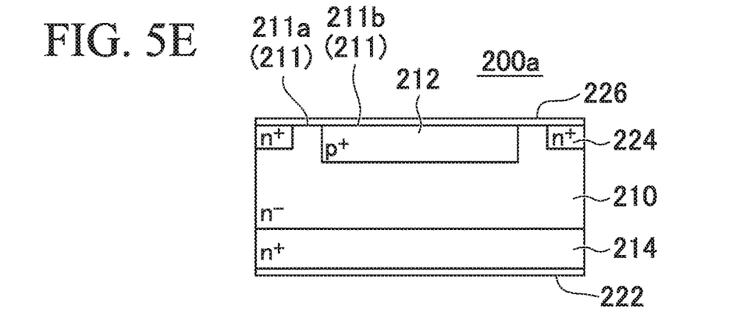

As shown in FIG. 5E, an oxide film forming step is a step of, after the channel stopper forming step and before the glass layer forming step described later, forming an oxide film 226 so as to cover the exposed surface 211.

The formation of the oxide film is performed by, for example, a thermal oxidation method using dry oxygen, as in the first embodiment. As a result, the oxide film 226 is formed on the one main surface of the semiconductor substrate 200a. At this time, a surface oxide film 222 is also formed on the other main surface of the semiconductor substrate 200a.

(Glass Layer Forming Step)

As shown in FIG. 6A, a glass layer forming step is a step of forming a glass layer 228 for passivation so as to cover the exposed surface 211 using a glass composition.

In the glass layer forming step, as in the first embodiment, a glass composition is deposited by electrophoresis on the one main surface side of the semiconductor substrate 200a. Then, the deposited glass composition is baked. As a result, the exposed surface 211 is covered with the glass layer 228 via the surface oxide film 226.

As the glass composition, one having the same composition as that of the first embodiment can be preferably used. As the glass composition, one having the same coefficient of linear expansion as that of the first embodiment can be preferably used.

(Etching Step)

As shown in FIGS. 6B and 6C, an etching step is a step of forming the oxide film 226 and the glass layer 228 on a predetermined region of the one main surface of the semiconductor substrate 200a.

In the etching step, for example, a mask M2 is formed on the one main surface side of the semiconductor substrate 200a so as to cover a boundary between the first exposure region 211a and the second exposure region 211b. Next, the glass layer 228 and the oxide film 226 are etched. Thus, the oxide film 226 and the glass layer 228 can be formed only in the predetermined region. At this time, the oxide film 222 is removed from the other main surface of the semiconductor substrate 200a.

(Electrode Forming Step)

As shown in FIG. 6D, the electrode forming step is a step of forming an anode electrode 230 and a cathode electrode 232 on the semiconductor substrate 200a.

In the electrode forming step, after the mask M2 is removed, the anode electrode 230 is formed in a region of the one main surface of the semiconductor substrate 200a, which is surrounded by the glass layer 228. Additionally, the cathode electrode 232 is formed on the rear surface of the semiconductor substrate 200a.

(Semiconductor Substrate Cutting Step)

As in the first embodiment, a semiconductor substrate cutting step is a process of cutting the semiconductor substrate 200a into chips using a dicing saw or the like. As a result, as shown in FIG. 6D, the semiconductor substrate 200a is formed into a chip, and the semiconductor device 200 which is a planar type pn diode is manufactured.

As described above, according to the semiconductor device manufacturing method of the present embodiment, the same effects as those of the first embodiment are achieved. In other words, by performing the hydrophobic treatment in the pretreatment step, it is possible to increase the concentration of the impurity 20 of the first conductivity type introduced into the first semiconductor layer 210 by the irradiation of laser light in the channel stopper formation step. As a result, even in a higher temperature environment, spreading of the depletion layer can be suppressed at the time of application of the reverse bias voltage, so that occurrence of leakage current can be suppressed. Therefore, it is possible to operate the semiconductor device normally. In other words, a highly reliable semiconductor device 200 can be provided.

Additionally, according to the semiconductor device manufacturing method of the present embodiment, in the glass layer forming step, the glass layer 228 is formed by baking the layer made of the glass composition formed so as to cover the exposed surface 211. Therefore, the impurity 20 of the first conductivity type introduced into the first exposed region 211a of the exposed surface 211 can be diffused in the first semiconductor layer 210 by the heat applied in the baking. This makes it possible to further suppress the spreading of the depletion layer at the time of application of the reverse bias voltage. As a result, generation of leakage current can be further suppressed, and a semiconductor device 200 with higher reliability can be provided.

Further, according to the semiconductor device manufacturing method of the present embodiment, after the channel stopper forming step and before the glass layer forming step, the oxide film 226 is formed so as to cover the exposed surface 211 in the oxide film forming step. As a result, the impurity 20 of the first conductivity type introduced into the first exposed region 211a of the exposed surface 211 can be diffused in the first semiconductor layer 210 by the heat applied in forming the oxide film 226. This makes it possible to further suppress the spreading of the depletion layer at the time of application of the reverse bias voltage, so that it is possible to further suppress the occurrence of the leakage current. Therefore, a semiconductor device 200 with higher reliability can be provided.

Moreover, according to the semiconductor device manufacturing method according to the present embodiment, the glass composition as the raw material of the glass layer 228 does not substantially contain Pb, As, and Sb, which are environmentally harmful substances. Thereby, the environmental burden can be reduced. Further, the glass layer 228 is made of lead-free glass having a dielectric constant lower than that of the lead-containing glass. As a result, even when a reverse bias voltage is applied in a high-temperature environment to a resin-molded semiconductor device obtained by molding the semiconductor device 200 with a resin, high density ions are suppressed from being induced to an interface between the mold resin and the glass layer 228 and an interface between the glass layer 228 and the first semiconductor layer 210. As a result, the high-temperature reverse bias withstand capability can be made higher than that of a resin-sealed semiconductor device obtained by molding with a resin a semiconductor device obtained by using a conventional lead-containing glass.

Additionally, according to the semiconductor device manufacturing method of the present embodiment, the glass composition as the raw material of the glass layer 228 does not substantially contain Li, Na, and K. Thereby, even if B (boron) is contained in the glass composition, B (boron) does not diffuse into silicon from the glass layer during the baking of the glass composition. Thereby, a highly reliable semiconductor device 200 can be provided.

Further, according to the semiconductor device manufacturing method of the present embodiment, since the glass layer 228 is formed by baking the layer made of the glass composition for protecting the semiconductor junction including glass fine particles prepared from the melt obtained by melting raw materials containing at least two alkaline earth metal oxides of $SiO_2$, $Al_2O_3$, $B_2O_3$, ZnO, CaO, MgO, and BaO, but substantially not containing Pb, As, Sb, Li, Na and K, it is possible to bake the glass composition at a relatively low temperature. This makes it difficult for the glass composition to crystallize during the baking process of the glass composition. As a result, it is possible to stably manufacture a semiconductor device 200 having a low reverse leakage current.

Moreover, according to the semiconductor device manufacturing method of the present embodiment, the glass composition satisfies that the amount of $SiO_2$ is within the range of 49.5 mol % to 64.3 mol %, the amount of $Al_2O_3$ is within the range of 3.7 mol % to 14.8 mol %, the amount of $B_2O_3$ is within the range of 8.4 mol % to 17.9 mol %, the amount of ZnO is within the range of 3.9 mol % to 14.2 mol %, and the amount of the alkaline earth metal oxide is within the range of 7.4 mol % to 12.9 mol %. Thereby, it is possible to suppress the increase in baking temperature of the glass composition, the deterioration of the chemical resistance of the glass layer 228, and the deterioration of the insulation property of the glass layer 128.

Additionally, according to the semiconductor device manufacturing method of the present embodiment, the average coefficient of linear expansion of the glass composition within the temperature range of 50° C. to 550° C. is within the range of $3.33 \times 10^{-6}$ to $4.08 \times 10^{-6}$. As a result, since the glass composition has a coefficient of linear expansion close to that of silicon, it is possible to prevent the semiconductor substrate 200a from warping during the manufacturing process.

Further, according to the semiconductor device manufacturing method of the present embodiment, the mixed solution of hydrofluoric acid (HF) and nitric acid ($HNO_3$) is used in the hydrophobic treatment in the pretreatment step. This makes it possible to perform the hydrophobic treatment using chemicals commonly used in ordinary semiconductor processes.

Although the preferred embodiments of the present invention have been described above with reference to the accompanying drawings, it is needless to say that the present invention is not limited to such examples. The shapes and combinations of the constituent members shown in the above examples are merely examples, and various modifications can be made based on design requirements or the like without departing from the gist of the present invention.

In the semiconductor device manufacturing method of the present invention, the oxide film forming step may not be performed.

The semiconductor device manufacturing method of the present invention may include at least the semiconductor substrate preparing step, the pretreatment step, the impurity supplying step, the channel stopper forming step, and the glass film forming step.

The semiconductor device of the present invention may include at least the semiconductor element, the channel stopper, and the glass layer.

Although the description has been given in the above embodiments assuming that the first conductivity type is n-type while the second conductivity type is p-type, the present invention is not limited thereto, and the first conductivity type may be p-type while the second conductivity type may be n-type.

In the above embodiment, a grain laser is used as a laser, but the present invention is not limited thereto. As the laser, a visible light laser other than the green laser, or a near infrared light laser (e.g., Nd-YAG laser) can also be preferably used.

In the above embodiment, although the liquid in which pyrophosphoric acid is dissolved in the organic solvent is used as the liquid containing the impurity of n-type, the present invention is not limited thereto. For example, it is possible to use a liquid in which a phosphorus compound other than pyrophosphoric acid or an arsenic compound is dissolved in various organic solvents.

In the above embodiment, the present invention has been described by exemplifying the pn diode as the semiconductor device, but the present invention is not limited thereto. For example, it is possible to apply the present invention to a diode other than a pn diode (e.g., a pin diode, a Schottky diode, etc.), a transistor (e.g., a bipolar transistor, a MOSFET, an IGBT, etc.), a thyristor, a triac, and other power semiconductor devices.

DESCRIPTION OF REFERENCE NUMERALS 10, 20 . . . impurity of n-type (first conductivity type), 100 . . . semiconductor device, 100a . . . semiconductor layered structure, 100b, 200a . . . semiconductor substrate, 100c . . . semiconductor element, 110, 210 . . . first semiconductor layer, 111, 211 . . . exposed surface, 111a, 211a . . . first exposed region, 111b, 211b . . . second exposed region, 112, 212 . . . second semiconductor layer, 114, 214 . . . third semiconductor layer, 120, 122, 222 . . . surface oxide film, 124, 224 . . . channel stopper, 126, 226 . . . oxide film, 128, 228 . . . glass layer, 130, 230 . . . anode electrode, 132, 232 . . . cathode electrode

The invention claimed is:
1. A semiconductor device manufacturing method comprising:
a semiconductor substrate preparing step of preparing a semiconductor substrate having an exposed surface where a pn junction is exposed, the pn junction being formed at a junction portion between a first semiconductor layer of a first conductivity type and a second semiconductor layer of a second conductivity type opposite to the first conductivity type, the exposed surface having
a first exposed region where the first semiconductor layer is exposed, and
a second exposed region where the second semiconductor layer is exposed;

a pretreatment step of performing a hydrophobic treatment only on the first exposed region of the exposed surface;

an impurity supplying step of supplying an impurity of the first conductivity type to the first exposed region;

a channel stopper forming step of irradiating the first exposed region with a laser beam to introduce the impurity of the first conductivity type into the first semiconductor layer, thus forming a channel stopper; and a glass layer forming step of forming a glass layer using a glass composition so as to cover the exposed surface.

2. The semiconductor device manufacturing method according to claim 1, wherein in the glass layer forming step, a layer made of the glass composition is formed so as to cover the exposed surface, and then the layer made of the glass composition is baked to form the glass layer.

3. The semiconductor device manufacturing method according to claim 1, further comprising:

an oxide film forming step of forming an oxide film so as to cover the exposed surface after the channel stopper forming step and before the glass layer forming step.

4. The semiconductor device manufacturing method according to claim 1, wherein the glass composition substantially does not contain Pb.

5. The semiconductor device manufacturing method according to claim 1, wherein the glass composition substantially does not contain As, Sb, Li, Na, and K.

6. The semiconductor device manufacturing method according to claim 1, wherein the glass composition contains at least two alkaline earth metal oxides of $SiO_2$, $B_2O_3$, $Al_2O_3$, ZnO, CaO, MgO, and BaO, and substantially does not contain Pb, As, Sb, Li, Na, and K.

7. The semiconductor device manufacturing method according to claim 6, wherein the glass composition satisfies that an amount of $SiO_2$ is within a range of 49.5 mol % to 64.3 mol %, an amount of $Al_2O_3$ is within a range of 3.7 mol % to 14.8 mol %, an amount of $B_2O_3$ is within a range of 8.4 mol % to 17.9 mol %, an amount of ZnO is within a range of 3.9 mol % to 14.2 mol %, and an amount of the alkaline earth metal oxide is within a range of 7.4 mol % to 12.9 mol %.

8. The semiconductor device manufacturing method according to claim 1, wherein an average linear expansion coefficient of the glass composition within a temperature range of 50° C. to 550° C. is within a range of $3.33 \times 10^{-6}$ to $4.08 \times 10^{-6}$.

9. The semiconductor device manufacturing method according to claim 1, wherein the exposed surface is an inner surface of a groove formed so as to divide the second semiconductor layer into a mesa shape and to reach the first semiconductor layer.

10. The semiconductor device manufacturing method according to claim 1, wherein in the hydrophobic treatment, a mixed solution of HF and $HNO_3$ is used.

11. The semiconductor device manufacturing method according to claim 10, wherein the mixed solution has a composition ratio of $HF:HNO_3=1:25$.

* * * * *